(12) United States Patent
Choi

(10) Patent No.: US 10,204,926 B2
(45) Date of Patent: Feb. 12, 2019

(54) DISPLAY DEVICE AND DISPLAY PANEL

(71) Applicant: LG DISPLAY CO., LTD., Seoul (KR)

(72) Inventor: HeeDong Choi, Seosan-si (KR)

(73) Assignee: LG DISPLAY CO., LTD., Seoul (KR)

(*) Notice: Subject to any disclaimer, the term of this patent is extended or adjusted under 35 U.S.C. 154(b) by 0 days.

(21) Appl. No.: 15/248,783

(22) Filed: Aug. 26, 2016

(65) Prior Publication Data

US 2017/0062478 A1    Mar. 2, 2017

(30) Foreign Application Priority Data

Aug. 27, 2015    (KR) .................. 10-2015-0121236

(51) Int. Cl.
*H01L 27/12*    (2006.01)

(52) U.S. Cl.
CPC ........ *H01L 27/124* (2013.01); *H01L 27/1248* (2013.01)

(58) Field of Classification Search
CPC ..................................................... H01L 27/12
USPC ................................................................ 257/72
See application file for complete search history.

(56) References Cited

U.S. PATENT DOCUMENTS

| 2008/0122085 A1* | 5/2008 | Kanaoka | H01L 23/3114 257/737 |
| 2008/0251787 A1* | 10/2008 | Kim | H01L 22/32 257/48 |
| 2011/0147748 A1* | 6/2011 | Baek | G02F 1/1345 257/59 |

* cited by examiner

*Primary Examiner* — Asok K Sarkar
*Assistant Examiner* — Dmitriy Yemelyanov
(74) *Attorney, Agent, or Firm* — Birch, Stewart, Kolasch & Birch, LLP

(57) ABSTRACT

A display device that is resistant to erosion caused by moisture infiltration is provided. In the display device, a driver circuit unit includes a driver chip and a film pad on which the driver chip is mounted. A display panel of the display device includes a panel pad bonded to the film pad. The panel pad includes first conductive lines electrically connected to signal lines disposed in an active area of the display panel, second conductive lines in contact with the first conductive lines, third conductive lines in contact with the second conductive lines, and a conductive film connecting the third conductive lines to the film pad. A contact area between the first conductive lines and the second conductive lines overlaps at least a portion of an area of the conductive film.

10 Claims, 10 Drawing Sheets

LINK

DISPLAY DEVICE AND DISPLAY PANEL

CROSS REFERENCE TO RELATED APPLICATION

This application claims priority to Korean Patent Application Number 10-2015-0121236 filed on Aug. 27, 2015, which is hereby incorporated by reference for all purposes as if fully set forth herein.

BACKGROUND

Field of the Invention

The embodiments of the present disclosure relate to a display device and a display panel.

Description of Related Art

In response to the development of the information society, there has been increasing demand for various types of display devices able to display images. Recently, a range of display devices, such as liquid crystal display (LCD) devices, plasma display panels (PDPs), and organic light-emitting diode (OLED) display devices, have come into use.

Such a display device includes a display panel on which a plurality of data lines and a plurality of gate lines are disposed, a data driver circuit for driving the plurality of data lines, and a gate driver circuit for driving the plurality of gate lines.

Each of the data driver circuit and the gate driver circuit may include at least one driver circuit unit. The driver circuit unit of the data driver circuit or the gate driver circuit may be bonded to a panel pad of the display panel.

Even in the case in which a variety of insulating films are disposed on a display panel, there is a high probability that moisture or the like may infiltrate into the panel pad to which the driver circuit unit is bonded.

Therefore, the panel pad of the display panel to which the driver circuit unit is bonded may suffer from erosion caused by moisture infiltration, thereby causing degradation in product reliability.

BRIEF SUMMARY

Various aspects of the present disclosure provide a display device having a pad structure that is resistant to erosion caused by moisture infiltration.

According to an aspect of the present invention, a display device may include a driver circuit unit including a driver chip and a film pad on which the driver chip is mounted; and a display panel including a panel pad bonded to the film pad.

In the display device, the panel pad may include first conductive lines electrically connected to signal lines disposed in an active area of the display panel; second conductive lines in contact with the first conductive lines; third conductive lines in contact with the second conductive lines; and a conductive film connecting the third conductive lines to the film pad.

In the panel pad, a contact area between the first conductive lines and the second conductive lines may overlap at least a portion of an area of the conductive film.

According to an aspect of the present invention, a display panel may include signal lines disposed in an active area; and a panel pad disposed in a non-active area corresponding to an area outside of the active area, the panel pad being bonded to a film pad on which a driver chip is mounted.

In the display panel, the panel pad may include first conductive lines electrically connected to the signal lines disposed; second conductive lines in contact with the first conductive lines; third conductive lines in contact with the second conductive lines; and a conductive film disposed above the third conductive lines In the panel pad, a contact area between the first conductive lines and the second conductive lines may overlap at least a portion of an area of the conductive film.

According to the present disclosure as set forth above, it is possible to provide a display device and a display panel having a pad structure that is resistant to erosion caused by moisture infiltration.

BRIEF DESCRIPTION OF THE DRAWINGS

The above and other objects, features and advantages of the present disclosure will be more clearly understood from the following detailed description when taken in conjunction with the accompanying drawings, in which.

DETAILED DESCRIPTION

Figure 1:
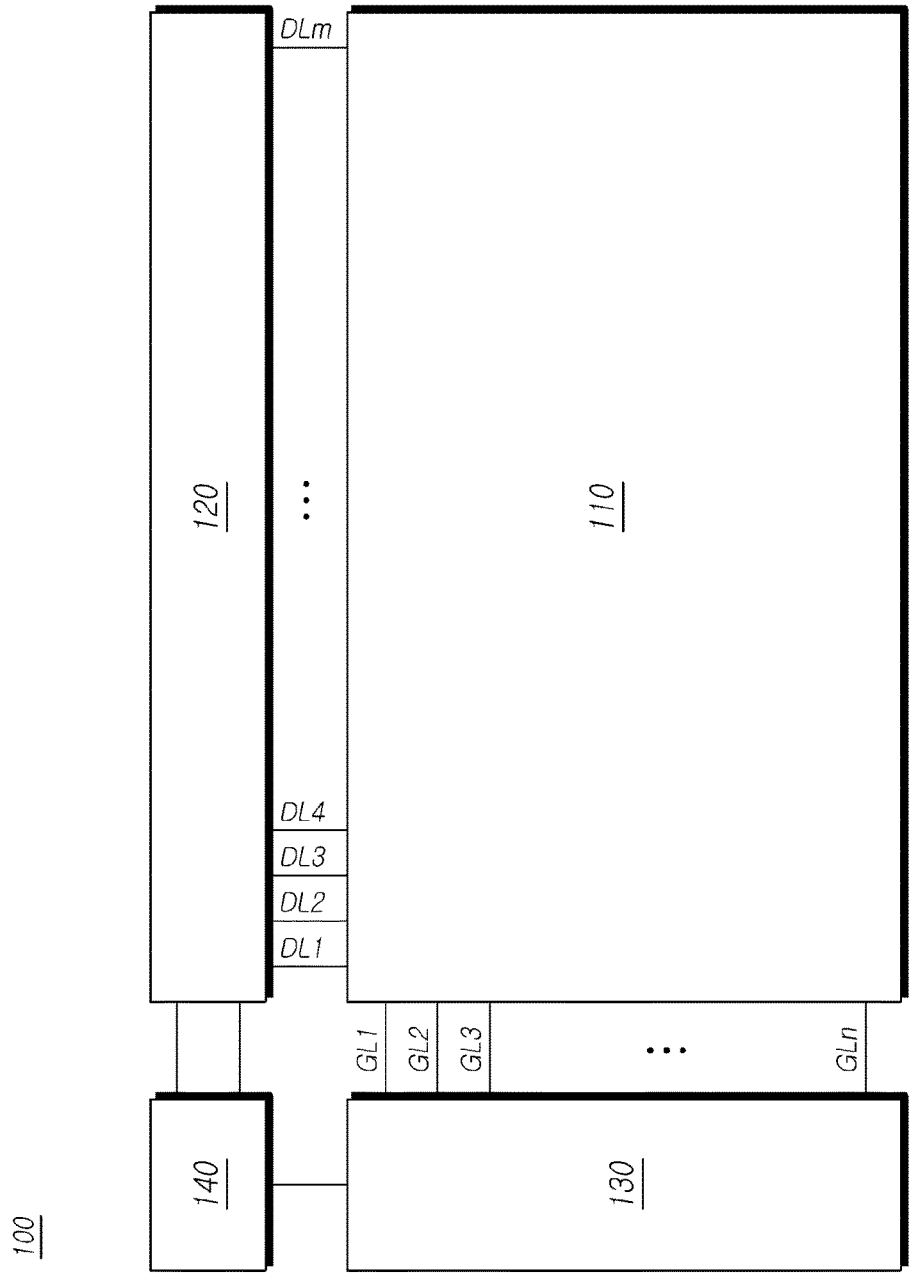
FIG. 1 is a configuration view schematically illustrating a display device according to exemplary embodiments.

Hereinafter, reference will be made to embodiments of the present disclosure in detail, examples of which are illustrated in the accompanying drawings. Throughout this document, reference should be made to the drawings, in which the same reference numerals and signs will be used to designate the same or like components. In the following description of the present disclosure, detailed descriptions of known functions and components incorporated herein will be omitted in the case that the subject matter of the present disclosure may be rendered unclear thereby.

It will also be understood that, while terms such as "first," "second," "A," "B," "(a)," and "(b)" may be used herein to describe various elements, such terms are only used to distinguish one element from another element. The substance, sequence, order or number of these elements is not limited by these terms. It will be understood that when an element is referred to as being "connected to" or "coupled to" another element, not only can it be "directly connected or coupled to" the other element, but it can also be "indirectly connected or coupled to" the other element via an "intervening" element. In the same context, it will be understood that when an element is referred to as being formed "on" or "under" another element, not only can it be directly formed on or under another element, but it can also be indirectly formed on or under another element via an intervening element.

FIG. 1 is a schematic configuration view illustrating a display device 100 according to exemplary embodiments. All the components of the display device according to all embodiments are operatively coupled and configured.

Referring to FIG. 1, the display device 100 according to exemplary embodiments includes a display panel 110 on which a plurality of data lines DL1 to DLm as well as a plurality of gate lines GL1 to GLn are disposed and a plurality of subpixels are formed, a data driver circuit 120 driving the plurality of data lines DL1 to DLm, a gate driver circuit 130 driving the plurality of gate lines GL1 to GLn, and a controller 140 controlling the data driver circuit 120 and the gate driver circuit 130.

The controller 140 controls the data driver circuit 120 and the gate driver circuit 130 by supplying a variety of control signals thereto.

The controller 140 starts scanning based on timing realized by each frame, converts image data input by an external source into a data signal format readable by the data driver circuit 120, outputs the converted image data, and at a suitable point in time, controls data processing in response to the scanning.

The controller 140 may be a timing controller used in the general display technology or a control device including a timing controller and being able to perform other control functions. The controller 140 may be included in the data driver circuit 120.

The data driver circuit 120 drives the plurality of data lines DL1 to DLm by supplying data voltages thereto. The data driver circuit 120 may be also referred to as a source driver circuit.

The gate driver circuit 130 sequentially drives the plurality of gate lines GL1 to GLn, by sequentially supplying scanning signals thereto. The gate driver circuit 130 may be also referred to as a scanning driver circuit.

The gate driver circuit 130 sequentially supplies scanning signals, respectively having an on or off voltage, to the plurality of gate lines GL1 to GLn under the control of the controller 140.

When a specific gate line is opened by the gate driver circuit 130, the data driver circuit 120 converts image data received from the controller 140 into analog data voltages and supplies the analog data voltages to the plurality of data lines DL1 to DLm.

Although the data driver circuit 120 is illustrated as being positioned on one side of (e.g., above or below) the display panel 110 in FIG. 1, the data driver circuit 120 may be positioned on both sides of (e.g., both above and below) the display panel 110 depending on the driving system, the design of the panel, and so on.

Similarly, although the gate driver circuit 130 is illustrated as being positioned on one side (e.g., to the left or to the right) of the display panel 110 in FIG. 1, the gate driver circuit 130 may be positioned on both sides (e.g., both to the left and to the right) of the display panel 110.

The controller 140 receives a variety of timing signals, including a vertical synchronization signal Vsync, a horizontal synchronization signal Hsync, an input data enable (DE) signal, and a clock (CLK) signal, as well as input image data, from an external source (e.g., an external host system).

The controller 140 not only outputs image data input from the external source by converting the image data into a data signal format readable by the data driver circuit 120, but also receives a variety of received timing signals, including a vertical synchronization signal, a horizontal synchronization signal, an input DE signal, and a clock signal, generates a variety of control signals, and outputs the variety of control signals to the data driver circuit 120 and the gate driver circuit 130 to control the data driver circuit 120 and the gate driver circuit 130.

For example, the controller 140 outputs a variety of gate control signals (GCSs), including a gate start pulse (GSP), a gate shift clock (GSC) signal, and a gate output enable (GOE) signal, to control the scanning driver 130.

Here, the GSP controls the operation start timing of one or more gate driver chips of the gate driver circuit 130. The GSC signal is a clock signal commonly input to the gate driver chips to control the shift timing of scanning signals (or gate pulses). The GOE signal designates the timing information of one or more gate driver chips.

In addition, the controller 140 outputs a variety of data control signals (DCSs), including a source start pulse (SSP), a source sampling clock (SSC) signal, and a source output enable (SOE) signal, to control the data driver circuit 120.

Here, the SSP controls the data sampling start timing of one or more source driver chips of the data driver circuit 120. The SSC signal is a clock signal controlling the data sampling timing of each of the source driver chips. The SOE signal controls the output timing of the data driver circuit 120.

The data driver circuit 120 may include one or more data driver chips to drive the plurality of data lines. Herein, the data driver chips may also be referred to as source driver integrated circuits (ICs).

Each of the data driver chips may be connected to the bonding pads of the display panel 110 by tape automated bonding (TAB) or chip-on-glass (COG) bonding, may be directly disposed on the display panel 110, or in some cases, may be integrated with the display panel 110. In addition, each of the data driver chips may be mounted on a film by chip-on-film (COF) processing, the film being connected to the display panel 100.

Each of the source driver chips may include a shift register, a latch circuit, a digital-to-analog converter (DAC), an output buffer, and so on.

In some cases, each of the source driver chips may further include an analog-to-digital converter (ADC).

The gate driver circuit 130 may include one or more gate driver chips. Herein, the gate driver chips may also be referred to as gate driver ICs.

Each of the gate driver chips may be connected to the bonding pads of the display panel 110 by tape automated bonding (TAB) or chip-on-glass (COG) bonding, may be implemented as a gate-in-panel (GIP)-type IC directly disposed on the display panel 110, or in some cases, may be integrated with the display panel 110. In addition, each of the gate driver chips may be mounted on a film by chip-on-film (COF) processing, the film being connected to the display panel 100.

Each of the gate driver chips may include a shift register, a level shifter, and so on.

The display panel 110 according to exemplary embodiments may include one or more source printed circuit boards (S-PCBs) for the circuit of one or more data driver chips to be connected to the circuit thereof and a control printed circuit board (C-PCB) on which control components and a variety electronic devices are mounted.

The one or more S-PCBs may have at least one source driver chip mounted thereon, or at least one film having a source driver chip mounted thereon may be connected to the one or more S-PCBs.

The C-PCB may have the controller 140, a power controller, and so on. While the controller 140 controls the operations of the data driver circuit 120 and the gate driver circuit 130, the power controller supplies a variety of voltages or currents or controls a variety of voltages or currents to be supplied to the display panel 110, the data driver circuit 120, the gate driver circuit 130, and so on.

The circuit of the one or more S-PCBs and the circuit of the C-PCB may be connected to each other via at least one connector.

The connector may be implemented as a flexible flat cable (FFC), a flexible printed circuit (FPC), or so on.

The one or more S-PCBs and the C-PCB may be integrated as a single PCB.

The display device 100 according to exemplary embodiments may be one of various types of devices, such as a liquid crystal display (LCD) device, an organic light-emitting display device, and a plasma display device.

Each of the subpixels disposed on the display panel 110 may include circuit elements, such as a transistor.

For example, when the display panel 110 is an organic light-emitting display panel, each of the subpixels may include circuit elements, such as an organic light-emitting diode (OLED) and a driving transistor for driving the OLED.

The types and number of circuit elements constituting each of the subpixels SP may be variously determined depending on the functions to be provided and the design thereof.

Here, the likelihood that patterns surrounding an area, in which the data driver chips and/or the gate driver chips are connected to the display panel 110, may be eroded by moisture infiltration is high.

Thus, the exemplary embodiments of the present disclosure provide a structure able to prevent the surrounding patterns from being eroded even in the case in which moisture has infiltrated into the area in which the data driver chips and/or the gate driver chips are connected to the display panel 110.

Hereinafter, this structure will be described in detail with reference to FIG. 2 to FIG. 10. In the following description, a case in which data driver chips and/or gate driver chips are formed by chip-on-film (COF) processing will be taken.

Figure 2:
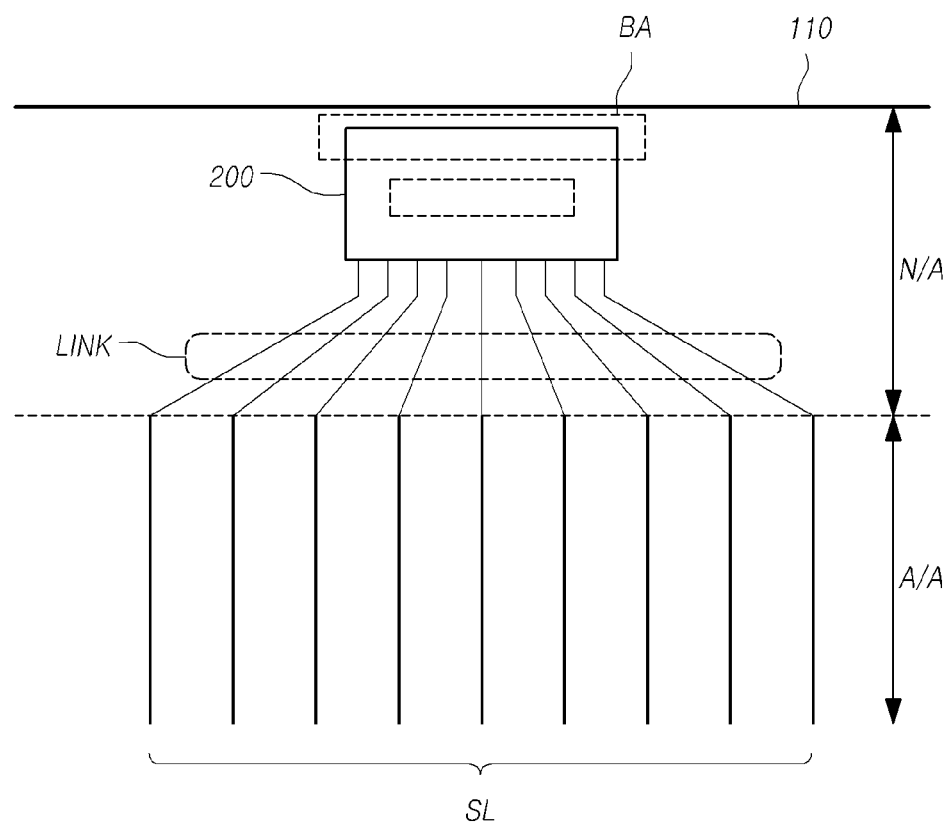
FIG. 2 illustrates a signal transfer structure between signal lines and a driver chip of a display panel according to exemplary embodiments.
Figure 3:
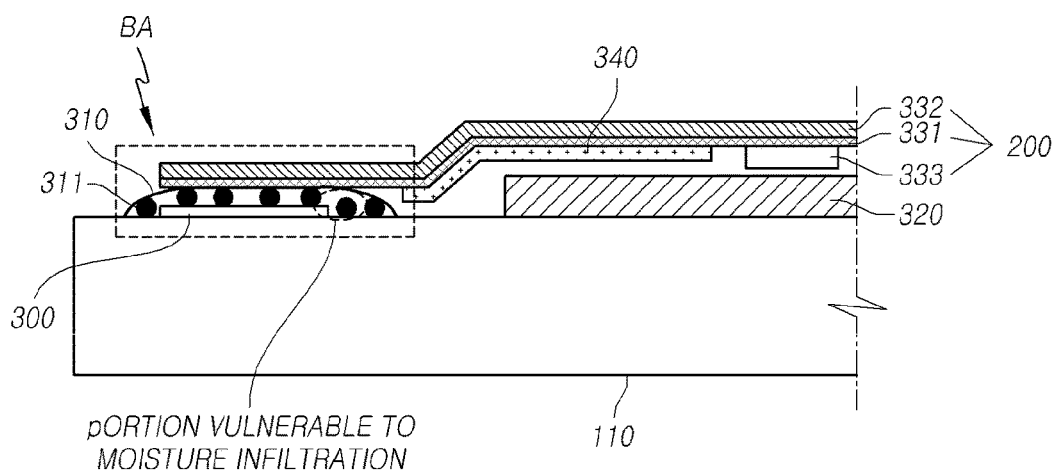
FIG. 3 is a cross-sectional view illustrating a bonding area in which a driver circuit unit is bonded to a panel pad of the display panel according to exemplary embodiments.
Figure 4:
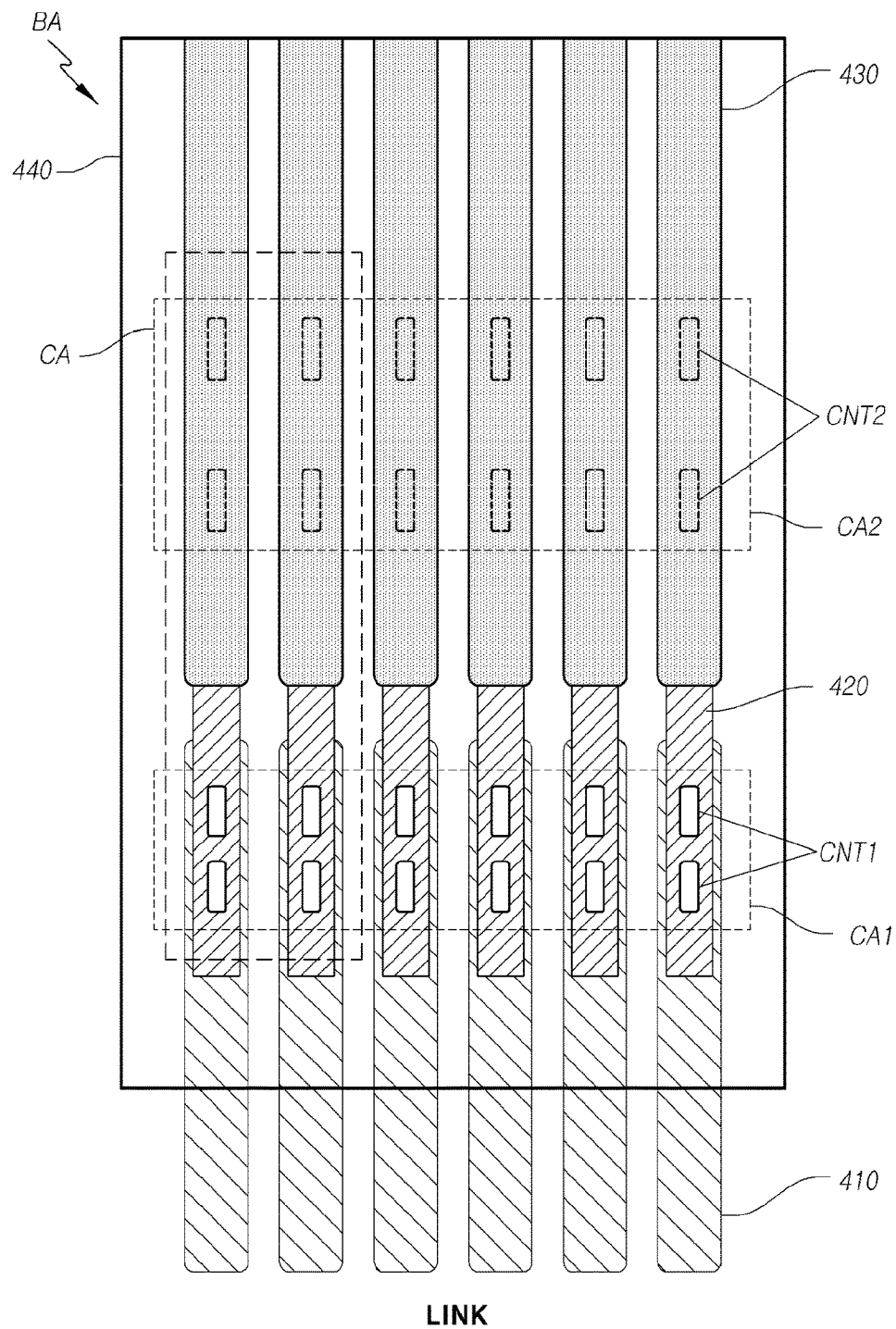
FIG. 4 and FIG. 5 are plan views illustrating the panel pad of the display panel in the display device according to exemplary embodiments.
Figure 5:
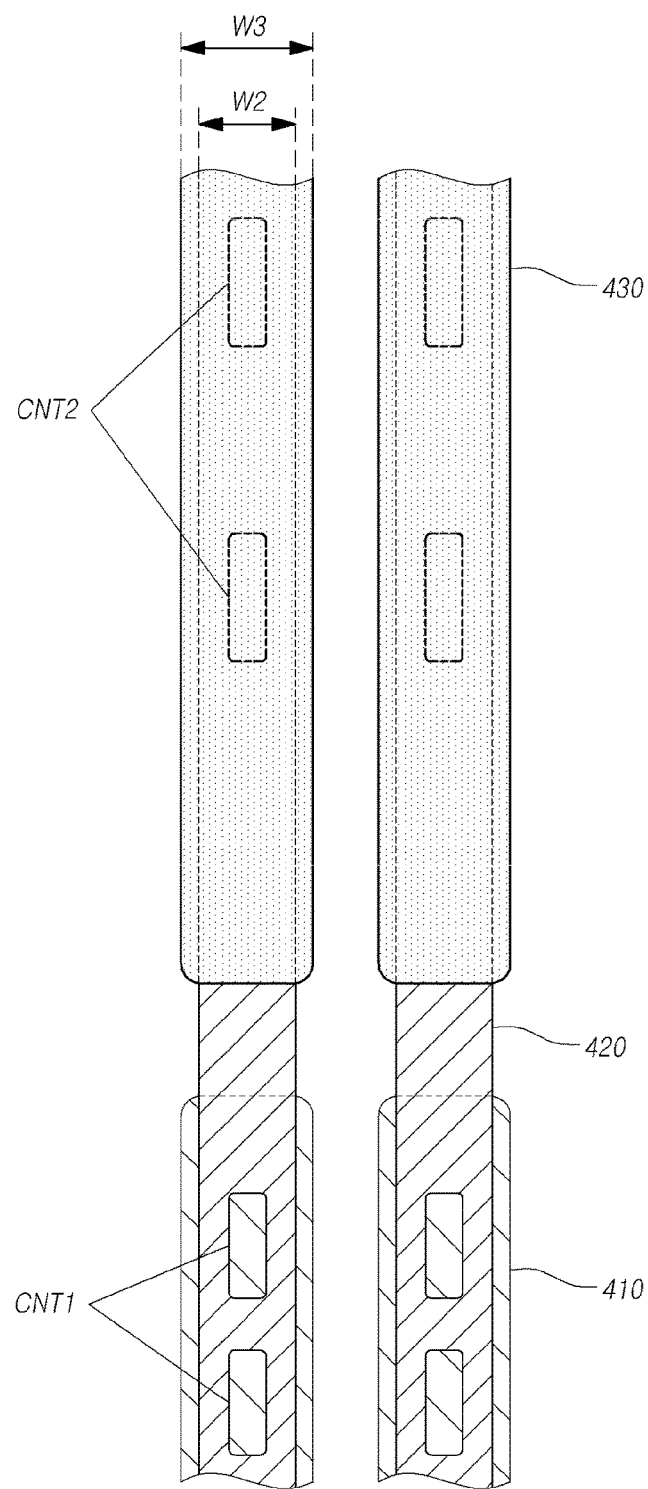
Figure 6:
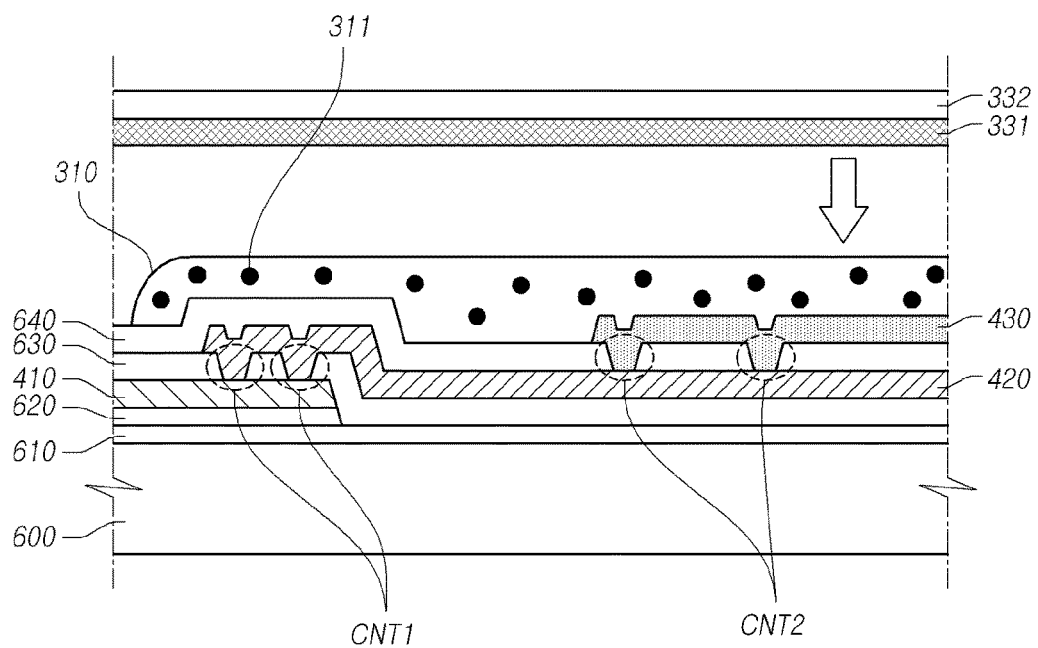
FIG. 6 is a cross-sectional view illustrating the panel pad of the display panel according to exemplary embodiments.

FIG. 2 illustrates a signal transfer structure between signal lines SL and a driver chip 333 of the display panel 110 in the display device 100 according to the exemplary embodiments, FIG. 3 is a cross-sectional view illustrating a bonding area BA in which a driver circuit unit 200 is bonded to a panel pad 300 of the display panel 110 according to the exemplary embodiments, FIG. 4 and FIG. 5 are plan views illustrating the panel pad 300 of the display panel 110 in the display device 100 according to the exemplary embodiments, and FIG. 6 is a cross-sectional view illustrating the panel pad 300 of the display panel 110 according to the exemplary embodiments.

Referring to FIG. 2, the display panel 110 according to the exemplary embodiments is divided into an active area A/A in which images are displayed and a non-active area N/A in which images are not displayed, the non-active area N/A corresponding to an area outside of the active area A/A (or a surrounding area of the active area A/A).

Signal lines SL, such as data lines and gate lines, are disposed in the active area A/A.

Link lines LINK are disposed in the non-active area N/A. The link lines LINK are connected to the driver circuit unit 200 for outputting electrical signals (e.g., data voltages and scanning signals) to the signal lines SL disposed in the active area A/A, and allow the driver circuit unit 200 to be electrically connected to the signal lines SL disposed in the active area A/A.

The driver circuit unit 200 and the bonding area BA of the non-active area N/A in which the driver circuit unit 200 is bonded to the display panel 110 will be described in more detail with reference to FIG. 3.

Referring to FIG. 3, the driver circuit unit 200 includes a driver chip 333, a film pad 331 on which the driver chip 333 is mounted, and a circuit film 332 to which the film pad 331 is attached.

The driver circuit unit 200 is bonded to the panel pad 300 of the display panel 110.

The film pad 331 of the driver circuit unit 200 is bonded to the panel pad 300 of the display panel 110 via a conductive film 310 having a plurality of conductive balls 311.

Specifically, the conductive film 310 is applied (or attached) to the display panel 110 to cover the panel pad 300, and the film pad 331 is aligned such that a portion thereof (i.e., a left portion thereof in FIG. 3) corresponds to the panel pad 300 and is then pressed against the panel pad 300. Consequently, the film pad 331 of the driver circuit unit 200 is connected to the panel pad 300 of the display panel 110.

Here, a line (e.g., a third line) of the panel pad 300 of the display panel 110 is connected to a corresponding line of the film pad 331 of the driver circuit unit 200.

The conductive film 310 may be, for example, an anisotropic conductive film (ACF).

Referring to FIG. 3, the film pad 331 of the driver circuit unit 200 is bonded to the panel pad 300 of the display panel 110 in the bonding area BA, while the film pad 331 is spaced apart from the display panel 110 in an area outside of the bonding area BA (i.e., in a portion of the display panel 110 on which the panel pad 300 is not present).

Referring to FIG. 3, in a space in which the film pad 331 of the driver circuit unit 200 is spaced apart from the display panel 110, an encapsulation layer 320 is disposed on the display panel 110.

Referring to FIG. 3, in the space in which the film pad 331 of the driver circuit unit 200 is spaced apart from the display panel 110, an insulating film 340 is attached to the bottom surface of the film pad 331 of the driver circuit unit 200.

The insulating film 340 is opened in a specific location in which the film pad 331 is exposed.

In the location in which insulating film 340 is opened such that the film pad 331 is exposed, the driver chip 333 is mounted.

As described above, the insulating film 340 attached to the bottom surface of the film pad 331 of the driver circuit unit 200 can protect the driver circuit unit 200, more particularly, the film pad 331, from moisture, air, and so on.

In addition, since the driver chip 330 is mounted on the portion of the film pad 331 exposed in the space in which the film pad 331 of the driver circuit unit 200 is spaced apart from the display panel 330, the space utilization of the display device 100 can be improved.

Referring to FIG. 3, at least a portion of the bonding area BA in which the film pad 331 of the driver circuit unit 200 is bonded to the panel pad 300 of the display panel 110 may be vulnerable to moisture infiltration or the like, depending on the bonding structure of the panel pad 300 of the display panel 110 and the film pad 331 of driver circuit unit 200 and the position in which the conductive film 310 is applied.

For example, at least one of the panel pad 300 of the display panel 110 and the film pad 331 of driver circuit unit 200 may be eroded by moisture that has infiltrated into the portion of the bonding area BA.

Such a phenomenon of erosion may cause a problem in the electrical connection between the panel pad 300 of the display panel 110 and the film pad 331 of the driver circuit unit 200, thereby leading to an issue, such as a circuit malfunction, or a significant structural issue in the surroundings of the eroded portion.

In this regard, exemplary embodiments provide a panel pad having a novel structure to prevent metal patterns on the portion in which moisture has infiltrated and the surroundings from being eroded by moisture.

Hereinafter, reference will be made to a panel pad 300 having a structure resistant to erosion caused by moisture infiltration.

Referring to FIG. 4 and FIG. 5, the panel pad 300 of the driver circuit unit 200 includes first conductive lines 410 electrically connected to signal lines SL in the active area A/A, second conductive lines 420 in contact with the first conductive lines 410, third lines 430 in contact with the second conductive lines 420, and a conductive film 310 connecting the third conductive lines 430 to the film pad 331.

The first conductive lines 410 act as link lines LINK to electrically connect the signal lines SL in the active area A/A of the display panel 110 to the driver chip 330 of the driver circuit unit 200.

The third conductive lines 430 are conductive lines in contact with the film pad 331 of the driver circuit unit 200.

The second conductive lines 420 are conductive lines connecting the first conductive lines 410 to the third conductive lines 430.

Referring to FIG. 4, the first conductive lines 410 are in contact with the second conductive line 420 via contact holes CNT1, while the second conductive lines 420 are in contact with the third conductive lines 430 via second contact holes CNT2.

Referring to FIG. 4, a contact area CA1 between the first conductive lines 410 and the second conductive lines 420 and a contact area CA2 between the second conductive lines 420 and the third conductive lines 430 are highly vulnerable to erosion caused by moisture infiltration.

However, as illustrated in FIG. 4, the contact area CA1 between the first conductive lines 410 and the second conductive lines 420 and the contact area CA2 between the second conductive lines 420 and the third conductive lines 430 overlaps at least a portion of a conductive film area 440 able to prevent moisture infiltration.

This configuration can consequently prevent the first conductive lines 410, the second conductive lines 420, and the third conductive lines 430 from being in direct contact with moisture, thereby preventing the first conductive lines 410, the second conductive lines 420, and the third conductive lines 430 from being eroded by moisture.

In particular, the second conductive lines 420 may be formed of a source/drain material vulnerable to erosion due to moisture depending on the design of the panel. In this case, the second conductive lines 420 vulnerable to erosion can be prevented from being eroded by designing the panel pad 300 such that the contact area CA1 between the first conductive lines 410 and the second conductive lines 420 overlaps at least a portion of the conductive film area 440.

The contact area CA1 between the first conductive lines 410 and the second conductive lines 420 overlapping at least a portion of the conductive film area 440 may mean that the entirety of the contact area CA1 overlaps the portion of the conductive film area 440 or a portion of the contact area CA1 overlaps the portion of the conductive film area 440.

In addition, referring to the vertical cross-section, the contact area CA1 between the first conductive lines 410 and the second conductive lines 420 is positioned below the conductive film area 440, while the entirety or a portion of the contact area CA1 overlaps the conductive film area 440.

Referring to FIG. 4 to FIG. 6, depending on the design of the panel, the first conductive lines 410 may be formed of the same gate material as gate electrodes and gate lines, the second conductive lines 420 may be formed of the same source/drain material as source electrodes, drain electrodes, and a variety of voltage lines, and the third conductive lines 430 may be formed of a pixel electrode material. Here, the pixel electrode material may be, for example, an anode electrode material of an organic light-emitting diode (OLED), a transparent electrode material, or the like.

As described above, when the first conductive lines 410 are formed of the gate material, the second conductive lines 420 are formed of the source/drain material, and the third conductive lines 430 are formed of the pixel electrode material depending on the design of the panel, the structure and type of transistors, and so on, the conductive film 310 is positioned on the third conductive lines 430 such that the third conductive lines 430 are connected to the film pad 331.

Consequently, the conductive film 310 can prevent moisture from infiltrating into the third conductive line 430 by a predetermined extent.

However, since the second conductive lines 420 are not connected to the film pad 331 of the driver circuit unit 200, the conductive film 310 may not be applied to the second conductive lines 420. Then, the second conductive lines 420 are vulnerable to moisture infiltration.

Regardless of such structural features, as described above, it is possible to apply the conductive film 310 such that the contact area CA1 between the first conductive lines 410 and the second conductive lines 420 overlaps at least a portion of the conductive film area 440, thereby preventing the second conductive lines 420 from being eroded by moisture.

The effect of preventing erosion due to moisture will be described in detail later with reference to FIG. 6.

Referring to FIG. 4 and FIG. 5, two or more first contact holes CNT1 and two or more second contact holes CNT2 may be present.

Thus, the contact resistance between the first conductive lines 410 and the second conductive lines 420 and the contact resistance between the second conductive line 420 and the third conductive lines 430 may be reduced. This consequently helps signals be accurately transferred between the film pad 331 of the driver circuit unit 200 and the panel pad 300 of the display panel 110.

Referring to FIG. 5, the widths W3 of the third conductive lines 430 connected to the film pad 331 of the driver circuit unit 200 are narrower than the widths W2 of the second conductive lines 420.

Since the widths W3 of the third conductive lines 430 are designed to be wider than the widths W2 of the second conductive lines 420 as described above, it is possible to increase the contact area between the film pad 331 of the driver circuit unit 200 and the third conductive lines 430. This consequently reduces the contact resistance between the film pad 331 of the driver circuit unit 200 and the third conductive lines 430, thereby preventing the intensity (or voltage level) of signals from decreasing.

The cross-sectional structure of the panel pad 300 will be described with reference to FIG. 6. It should be understood that FIG. 6 illustrates a state of the panel pad 300 before compression after the conductive film 310 including the conductive balls 311 has been applied thereto, for the sake of brevity.

A buffer layer 610 is disposed on a substrate 600 on which thin film transistors (TFTs) are disposed.

The first conductive lines 410 formed of a gate material are disposed on the buffer layer 610. The first conductive lines 410 are insulated by a gate insulating film 620.

A first insulating film 630 is disposed on the first conductive lines 410, and the second conductive lines 420 are disposed on the first insulating film 630.

One end of each of the second conductive lines 420 is disposed in the contact area CA1 in which the second conductive lines 420 are in contact with the first conductive lines 410, and the other end of each of the second conductive lines 420 is disposed in the bonding area BA in which the film pad 331 of the driver circuit unit 200 is bonded to the panel pad 300.

The second conductive lines 420 are layered on the first conductive lines 410 with the first insulating film 630 being sandwiched therebetween. The second conductive lines 420 are in contact with the first conductive lines 410 via the first contact holes CNT1 in the first insulating film 630.

The second insulating film 640 is disposed on the second conductive lines 420.

The third conductive lines 430 are disposed on the second insulating film 640.

The second insulating film 640 can prevent the second conductive lines 420 from being exposed to the ambient air. Thus, the second conductive lines 420 can be prevented from contact with moisture by the second insulating film 640.

The third conductive lines 430 are disposed in the bonding area BA in which the film pad 331 of the driver circuit unit 200 is bonded to the panel pad 300.

The second conductive lines 420 are in contact with the third conductive lines 430 via the second contact holes CNT2 of the second insulating film 640.

The conductive film 310 including the conductive balls 311 is applied to cover the third conductive lines 430 to allow the third conductive lines 430 to be connected to the film pad 331.

Here, the conductive film 310 may extend to a location above the contact area between the first conductive lines 410 and the second conductive lines 420. That is, the contact area between the first conductive lines 410 and the second conductive lines 420 may be positioned below the conductive film area 440.

Even in the case in which the second insulating film 640 covers the second conductive lines 420, the second conductive lines 420 may be exposed externally depending on the state of formation of the second insulating film 640.

In contrast, according to the exemplary embodiments, the conductive film 310 is applied to a portion above the contact area between the first conductive lines 410 and the second conductive lines 420, i.e., the conductive film 310 covers the distal ends of the second conductive lines 420. Even in the case in which the second insulating film 640 does not completely insulate predetermined portions of the second conductive lines 420 depending on the state of formation of the second insulating film 640, the second conductive lines 420 can be prevented from being exposed to the ambient air, thereby being prevented from being eroded.

Referring to the multilayer structure of the panel pad 300 illustrated in FIG. 6, the first conductive lines 410, the first insulating film 630, the second conductive lines 420, the second insulating film 640, the third conductive lines 430, and the conductive film 310 are stacked sequentially on the substrate 600 on which the TFTs are disposed.

In the multilayer structure as described above, structures for preventing all of the first conductive lines 410, the second conductive lines 420, and the third conductive lines 430 from being exposed to the ambient are summarized as follows: Protection structures, such as the first insulating film 410 and the second insulating film 420, are present on the first conductive lines 410 to prevent the first conductive lines 410 from being exposed to the ambient air, thereby preventing erosion caused by moisture. The second insulating film 640 and the conductive film 310 are present on the second conductive lines 420 to prevent the second conductive lines 420 from being exposed to the ambient air, thereby preventing erosion caused by moisture. In addition, the conductive film 310 is present on the third conductive lines 430 to prevent the third conductive lines 430 from being exposed to the ambient air, thereby preventing erosion caused by moisture.

The driver circuit unit 200 illustrated in FIG. 2 to FIG. 6 may be a data driver circuit unit included in the data driver circuit 120 or a gate driver circuit unit included in the gate driver circuit 130.

Hereinafter, descriptions will be made to the bonding structure between the driver circuit unit 200 and the panel pad 300 and a link structure between the panel pad 300 and the signal lines SL in the active area A/A with reference to FIG. 7 and FIG. 8, with respect to the case in which the driver circuit unit 200 is a data driver circuit and the case in which the driver circuit unit 200 is a gate driver circuit.

Figure 7:
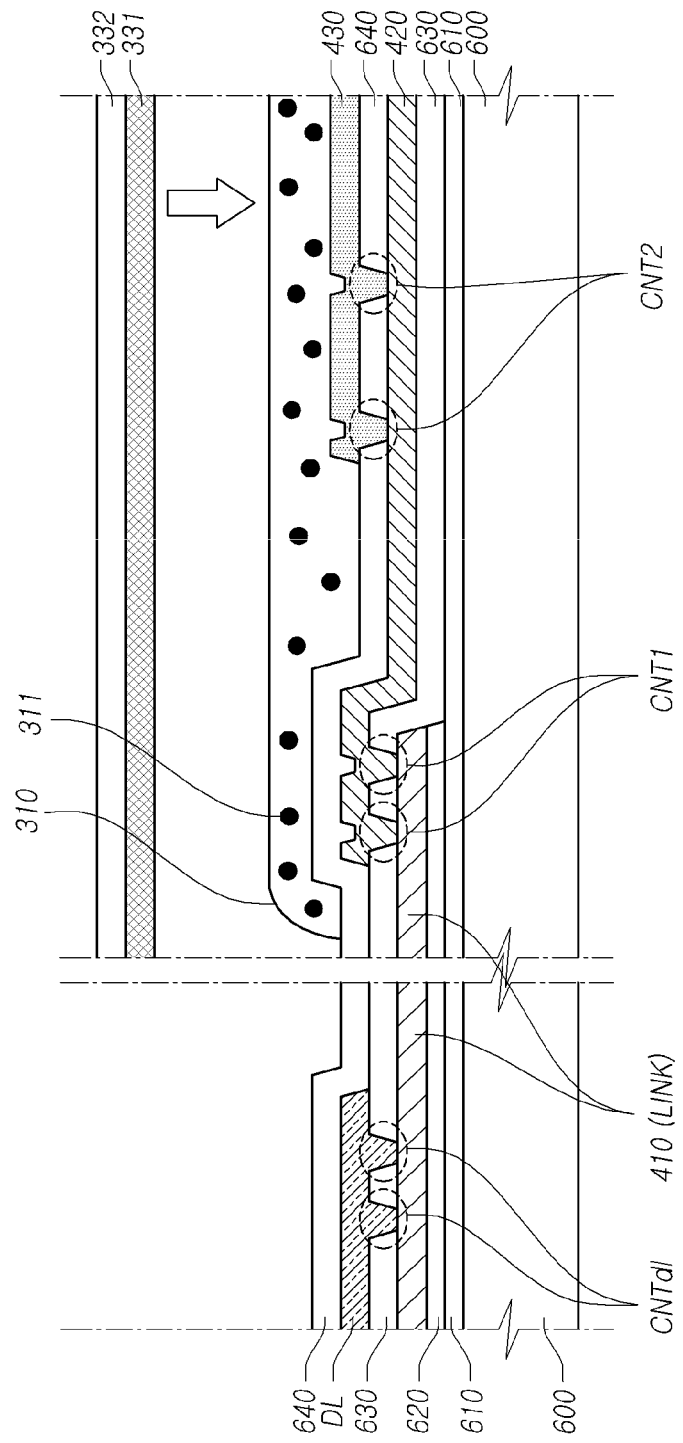
FIG. 7 is a cross-sectional view of the bonding area in which the driver circuit unit acting as a data driver circuit is bonded to the panel pad of the display panel according to exemplary embodiments.

FIG. 7 is a cross-sectional view of the bonding area BA in which the driver circuit unit 200 acting as a data driver circuit is bonded to the panel pad of the display panel 110 according to the exemplary embodiments.

Referring to FIG. 7, when the driver circuit unit 200 is a data driver circuit, the driver chip 333 mounted on the film pad 331 of the driver circuit unit 200 may be a data driver chip (or a source driver IC).

The first conductive lines 410 act as link lines LINK for forward signal transfer (from the driver chip to the panel) such that the driver chip 333 can provide electrical signals required for display driving (e.g., data voltages corresponding to image signals or driving voltages or reference voltages required for display driving) to the signal lines SL disposed on the active area A/A of the display panel 110, i.e., the electrical signals output by the driver chip 333 can be transferred from the film pad 321 on which the driver chip 333 is mounted to the signal lines SL disposed in the active area A/A through the third conductive lines 430 and the second conductive lines 420.

The signal lines SL, disposed in the active area A/A and electrically connected to the first conductive lines 410, may be data lines DL formed of a different material from the first conductive lines 410, or may be voltage lines (e.g., driving voltage lines or reference voltage lines) arranged in the same direction as the data lines DL.

The data lines DL or the voltage lines arranged in the same direction may be in contact with the first conductive lines 410 via contact holes CNTd1 in the first insulating film 630.

As described above, when the driver circuit unit 200 bonded to the panel pad 300 is a data driver circuit, an efficient connecting structure between the signals lines SL, such as the data lines DL, in the active area A/A and the panel pad 300 can be provided.

The first conductive lines 410 may also act as link lines LINK for reverse signal transfer (from the panel to the driver chip) such that voltage signals can be transferred from the signal lines SL disposed in the active area A/A to the driver chip 333 mounted on the film pad 321 through the second conductive lines 420 and the third conductive lines 430.

For example, when the display panel 110 is an organic light-emitting display panel, an analog-to-digital converter (ADC) included in the driver chip 333 may measure the voltage of a specific node (e.g., a source node of a driver transistor or a first electrode node of an OLED) in the display panel 110 to sense a characteristic value (e.g., a threshold voltage or a level of mobility) of the transistor or the OLED in a subpixel.

Figure 8:
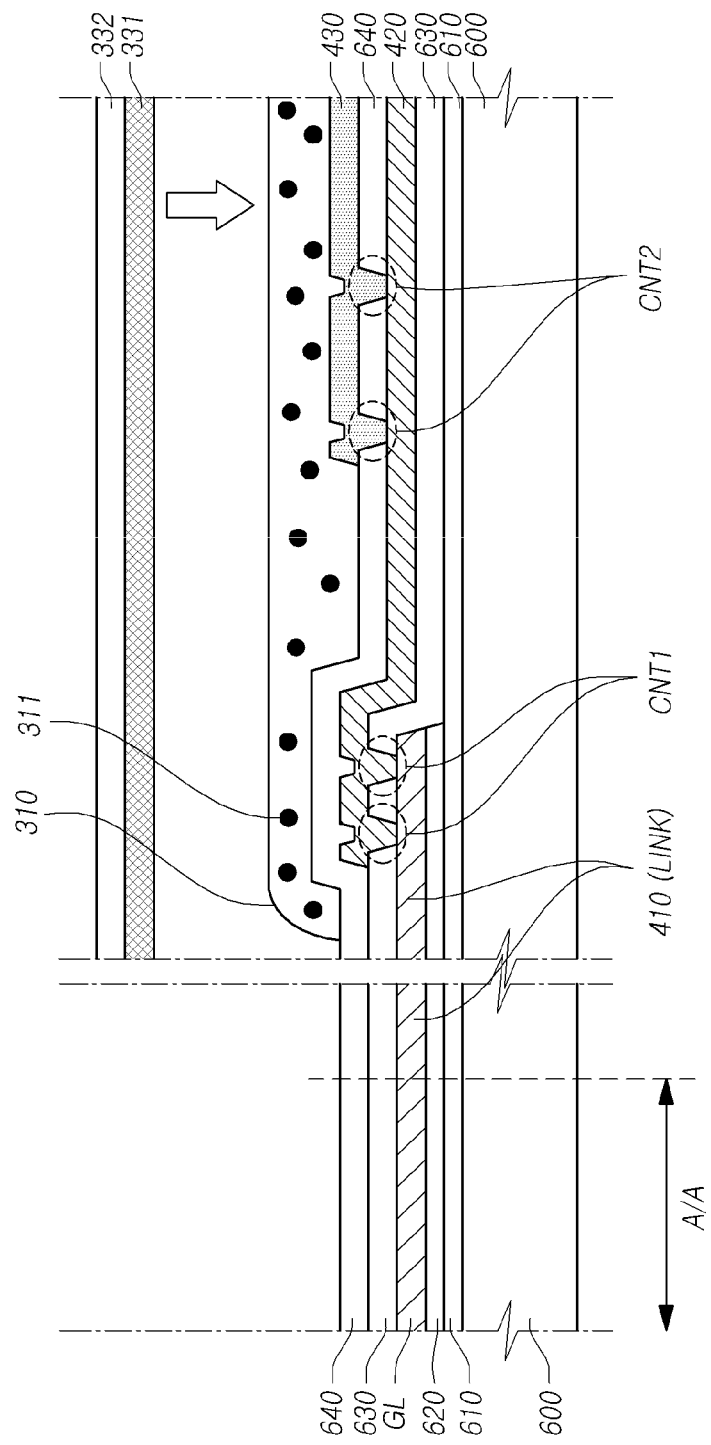
FIG. 8 is a cross-sectional view of the bonding area in which the driver circuit unit acting as a gate driver circuit is bonded to the panel pad of the display panel according to exemplary embodiments.

FIG. 8 is a cross-sectional view of the bonding area BA in which the driver circuit unit 200 acting as a gate driver circuit is bonded to the panel pad of the display panel 110 according to the exemplary embodiments.

Referring to FIG. 8, when the driver circuit unit 200 is a gate driver circuit unit included in the gate driver circuit 130, the driver chip 333 mounted on the film pad 331 of the driver circuit unit 200 may be a gate driver chip (or a gate driver IC).

The first conductive lines 410 may act as link lines LINK to transfer electrical signals (e.g., gate signals) required for display driving to the signal lines SL disposed in the active area A/A of the display panel 110, i.e., the electrical signals output by the driver chip 333 can be transferred from the film pad 321 on which the driver chip 333 is mounted to the signal lines SL disposed in the active area A/A through the third conductive lines 430 and the second conductive lines 420.

The signal lines SL, disposed in the active area A/A and electrically connected to the first conductive lines 410, may be gate lines GL formed of the same material as the first conductive lines 410 or voltage lines arranged in the same direction as the gate lines GL.

As described above, when the driver circuit unit 200 bonded to the panel pad 300 is a gate driver circuit, an efficient connecting structure between the signals lines SL, such as the gate lines GL, in the active area A/A and the panel pad 300 can be provided.

Referring to the panel pad 300 and the link structure regarding data driving as illustrated in FIG. 7, image signals (or data voltages) are transferred to the data lines DL by three interlayer movements through the three groups of contact holes CNT2, CNT1, and CNTd1.

More specifically, with reference to FIG. 7, the image signals (or data voltages) are transferred through the third conductive lines 430 disposed on a pixel electrode forming layer, the second conductive lines 420 disposed on a source/drain forming layer, and the first conductive lines 410 corresponding to link lines disposed on a gate forming layer and then jump to the source/drain forming layer before being transferred to the data lines DL.

Referring to the panel pad 300 and the link structure regarding gate driving as illustrated in FIG. 8, gate signals are transferred to the gate lines GL by two interlayer movements through the two groups of contact holes CNT2 and CNT1.

More specifically, with reference to FIG. 8, the gate signals are transferred to the gate lines GL disposed on the gate forming layer through the third conductive lines 430 disposed on the pixel electrode forming layer, the second conductive lines 420 disposed on the source/drain forming layer, and the first conductive lines 410 corresponding to the link lines disposed on the same gate forming layer.

The transfer of image signals (or data voltages) through three interlayer movements and the transfer of gate signals through two interlayer movements are related to the structure of the TFTs on the substrate 600.

Figure 9:
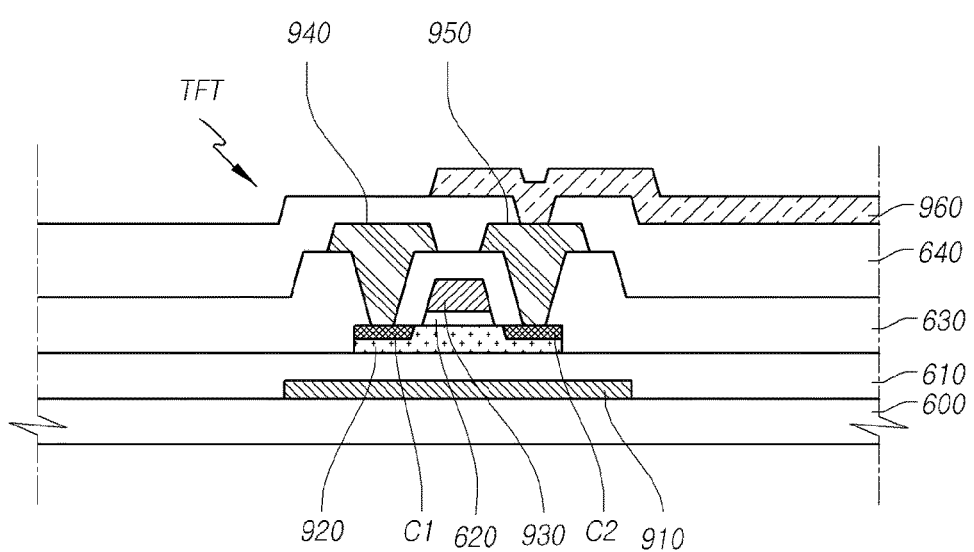
FIG. 9 is a cross-sectional view illustrating a thin film transistor (TFT) disposed on the display panel according to exemplary embodiments.

FIG. 9 is a cross-sectional view illustrating a TFT disposed on the display panel 110 according to the exemplary embodiments.

The substrate 600 of the display panel 110 according to the exemplary embodiments has a plurality of subpixels arranged thereon, with at least one thin TFT being disposed on each of the subpixels.

An active layer 920 is disposed on the substrate 600.

A light-blocking layer 910 is disposed below the active layer 920.

Predetermined portions of the active layer 920 that are supposed to form source/drain nodes C1 and C2 of the TFT are formed to be conductive.

The gate insulating film 620 is disposed on the active layer 920, and a gate electrode 930 of the TFT is disposed on the gate insulating film 620. The first insulating film 630, corresponding to an interlayer insulating film, is disposed on the resultant structure.

Source/drain electrodes 940 and 950, corresponding to the source/drain material, are disposed on the first insulating film 630. The source/drain electrodes 940 and 950 are connected to the conductive source/drain nodes C1 and C2 in the active layer 920 through contact holes.

The second insulating film 640 is disposed above the first insulating film 630 and the source/drain electrodes 940 and 950.

A pixel electrode 960, corresponding to the same material layer as the third conductive lines 430, is disposed on the second insulating film 640. The pixel electrode 960 is connected to one electrode 950 of the source/drain electrodes 940 and 950 through a contact hole in the second insulating film 640.

The light-blocking layer 910 is disposed below the active layer 920.

Referring to FIG. 9, the TFT may be a top-gate transistor.

Figure 10:
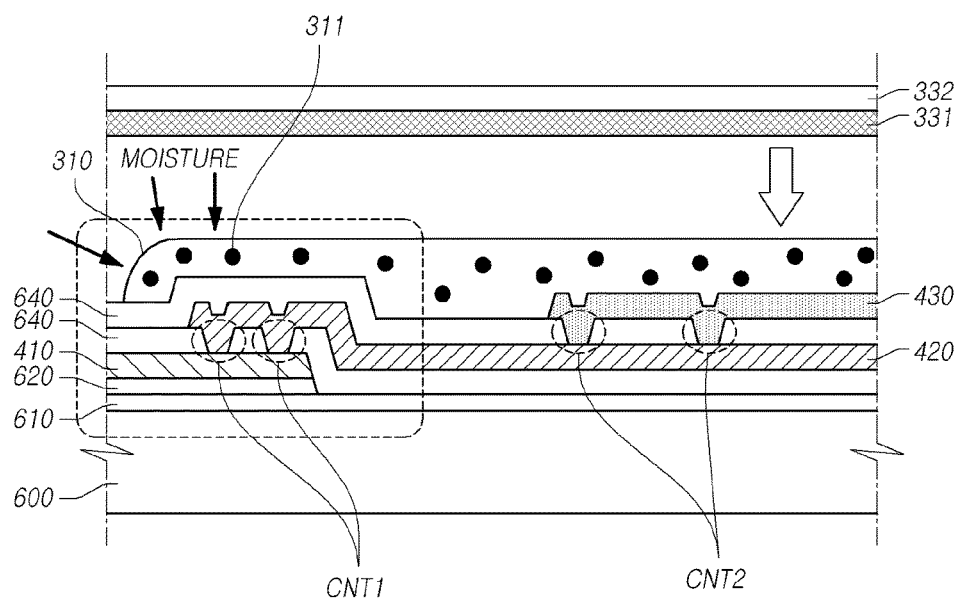
FIG. 10 is a cross-sectional view illustrating an effect of preventing erosion caused by moisture, produced by the structure of the panel pad of the display panel according to exemplary embodiment.

FIG. 10 is a cross-sectional view illustrating an effect of preventing erosion caused by moisture, produced by the structure of the panel pad 300 of the display panel 110 according to the exemplary embodiments.

Referring to FIG. 10, in the panel pad 300, the contact area between the first conductive lines 410 and the second conductive lines 420 is positioned below the conductive film area 440 to which the conductive film 310 is applied.

Consequently, even in the case in which the second insulating film 640 does not completely insulate a portion of the second conductive lines 420 depending on the state of formation of the second insulating film 640, the conductive film 310 can prevent moisture from infiltrating into the contact area between the first conductive lines 410 and the second conductive lines 420. It is thereby possible to prevent the second conductive lines 420 or the like from being eroded by moisture or the like.

According to the exemplary embodiments as described above, the display device 100 and the display panel 110 having the pad structure resistant to erosion caused by moisture infiltration can be provided.

The foregoing descriptions and the accompanying drawings have been presented in order to explain the certain principles of the present disclosure. A person skilled in the art to which the disclosure relates could make many modifications and variations by combining, dividing, substituting for, or changing the elements without departing from the principle of the disclosure. The foregoing embodiments disclosed herein shall be interpreted as illustrative only but not as limitative of the principle and scope of the disclosure. It should be understood that the scope of the disclosure shall be defined by the appended Claims and all of their equivalents fall within the scope of the disclosure.

What is claimed is:

1. A display device comprising:
a driver circuit unit comprising a driver chip and a film pad on which the driver chip is mounted; and
a display panel comprising a panel pad bonded to the film pad,
wherein the panel pad comprises:
first conductive lines electrically connected to signal lines disposed in an active area of the display panel;
second conductive lines in contact with the first conductive lines at a first contact area;
third conductive lines in contact with the second conductive lines at a second contact area; and
a conductive film covering a portion of the third conductive lines and the second contact area, and connecting the third conductive lines to the film pad, and
wherein the conductive film extends from the first contact area of the first conductive lines and the second conductive lines to the covered portion of the third conductive lines and the second contact area of the second conductive lines and the third conductive lines,
wherein:
the first conductive lines are in contact with the second conductive lines via first contact holes of a first insulating film, the second conductive lines having portions disposed in the first contact holes, and
the second conductive lines are in contact with the third conductive lines via second contact holes of a second insulating film, the third conductive lines having portions disposed in the second contact holes, and
wherein the conductive film adheres to the second insulating film and the third conductive lines.

2. The display device according to claim 1, wherein the first conductive lines are formed of a gate material, the second conductive lines are formed of a source/drain material, and the third conductive lines are formed of a pixel electrode material.

3. The display device according to claim 1, wherein the first conductive lines, the first insulating film, the second conductive lines, the second insulating film, the third conductive lines, and the conductive film are stacked sequentially on a substrate on which a thin film transistor is disposed.

4. The display device according to claim 1, wherein the first contact holes are two or more first contact holes, and the second contact holes are two or more second contact holes.

5. The display device according to claim 1, wherein widths of the third conductive lines are wider than widths of the second conductive lines.

6. The display device according to claim 1, wherein the signal lines, disposed in the active area and electrically connected to the first conductive lines, comprise data lines formed of a different material from the first conductive lines.

7. The display device according to claim 6, wherein the data lines are in contact with the first conductive lines through contact holes of a first insulating film.

8. The display device according to claim 1, wherein the signal lines, disposed in the active area and electrically connected to the first conductive lines, comprise gate lines formed of a same material as the first conductive lines.

9. The display device according to claim 1, further comprising an insulating film attached to a bottom surface of the film pad,
wherein the driver chip is mounted on a portion of the bottom surface of the film pad that is exposed through an opening of the insulating film.

10. A display panel comprising:
signal lines disposed in an active area; and
a panel pad disposed in a non-active area corresponding to an area outside of the active area, the panel pad being bonded to a film pad, and a driver chip being mounted on the film pad,
wherein the panel pad comprises:
first conductive lines electrically connected to the signal lines;
second conductive lines in contact with the first conductive lines at a first contact area;
third conductive lines in contact with the second conductive lines at a second contact area; and
a conductive film disposed above the third conductive lines to cover a portion of the third conductive lines and the second contact area,
wherein the conductive film extends from the first contact area of the first conductive lines and the second conductive lines to the covered portion of the third conductive lines and the second contact area of the second conductive lines and the third conductive lines,
wherein:
the first conductive lines are in contact with the second conductive lines via first contact holes of a first insulating film, the second conductive lines having portions disposed in the first contact holes, and
the second conductive lines are in contact with the third conductive lines via second contact holes of a second insulating film, the third conductive lines having portions disposed in the second contact holes, and
wherein the conductive film adheres to the second insulating film and the third conductive lines.

* * * * *